(12) United States Patent
Tanaka et al.

(10) Patent No.: US 7,885,696 B2
(45) Date of Patent: Feb. 8, 2011

(54) METHOD FOR SEARCHING FOR MATERIAL GENERATING INTERBAND PHASE DIFFERENCE SOLITON

(75) Inventors: Yasumoto Tanaka, Tsukuba (JP); Adrian Crisan, Tsukuba (JP); Akira Iyo, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 619 days.

(21) Appl. No.: 11/838,586

(22) Filed: Aug. 14, 2007

(65) Prior Publication Data

US 2008/0214402 A1 Sep. 4, 2008

(30) Foreign Application Priority Data

Sep. 13, 2006 (JP) .............................. 2006-248579

(51) Int. Cl.
- G01N 27/76 (2006.01)
- G01N 27/72 (2006.01)
- H01L 39/24 (2006.01)

(52) U.S. Cl. .................. 505/162; 505/845; 505/846; 505/400; 505/727; 324/248; 324/262; 324/201; 324/259

(58) Field of Classification Search .............. 505/400, 505/727; 324/248, 262, 201, 259
See application file for complete search history.

(56) References Cited

FOREIGN PATENT DOCUMENTS

| JP | 2003-209301 | 7/2003 |
|----|-------------|--------|
| JP | 2005-085971 | 3/2005 |

OTHER PUBLICATIONS

Tanaka et al, "Interpretation of Abnormal AC Loss Peak Based on Vortex-Molecule Model for a Multicomponent Cuprate Superconductor," Japan. J. App. Phys, 2007, 46(1), pp. 134-145.*

A. Gurevich, et al., "Interband Phase Modes and Nonequilibrium Solition Structures in Two-Gap Superconductors", The American Physical Society, vol. 90, No. 4, pp. 047004-1-047004-4.

E. Harashima, et al., "Low-Resistivity Contacts to the Surface of Superconductor Thin Films", Superconductor Science and Technology, vol. 15, 2002, pp. 29-31.

Jun Goryo, et al., Deconfinement of Vortices With Continuously Variable Fractions of the Unit Flux Quanta in Two-Gap Superconductors, EPL Draft, Aug. 9, 2007, 5 Pages.

Yasumoto Tanaka, et al., "Interpretation of Abnormal AC Loss Peak Based on Vortex—Molecule Model for a Multicomponent Cuprate Superconductor", Japanese Journal Applied Physics, vol. 46, No. 1, 2007, pp. 134-145.

Michael Tinkham, Introduction to Superconductivity, McGraw-Hill, pp. 336 and 337.

Fedor Gomory, "Characterization of High-Temperature Superconductors by AC Susceptibility Measurements", Superconductor Science and Technology, vol. 10, 1997, pp. 523-542.

J. Deak, et al. "Irreversibility Line in $YBa_2Cu_3O_7$ Thin Films: Correlation of Transport and Magnetic Behavior", The American Physical Society, vol. 49, No. 9, Mar. 1, 1994, pp. 6270-6279.

A. Crisan, et al. "Vortex Melting Line and Anisotropy of High-Pressure-Synthesized $TlBa_2Ca_2Cu_3O_{10-y}$ High-Temperature Superconductor From Third-Harmonic Susceptibility Studies", American Institute of Physics, vol. 83, No. 3, Jul. 21, 2003, pp. 506-508.

* cited by examiner

Primary Examiner—Stanley Silverman
Assistant Examiner—Kallambella Vijayakumar
(74) Attorney, Agent, or Firm—Oblon, Spivak, McClelland, Maier & Neustadt, L.L.P.

(57) ABSTRACT

A method of searching for a material fated to generate an interband phase difference soliton includes the steps of generating an AC in a soliton candidate material, identifying a loss of AC magnetic susceptibility of the siliton candidate material due to a turn and a twist cut of a vortex line and judging whether or not the soliton candidate material is capable of generating soliton.

4 Claims, 6 Drawing Sheets

METHOD FOR SEARCHING FOR MATERIAL GENERATING INTERBAND PHASE DIFFERENCE SOLITON

BACKGROUND OF THE INVENTION

1. Field of the Invention

This invention relates to a device and a method for efficiently searching for a material capable of forming an interband phase difference soliton circuit that is one of the superconducting circuits.

2. Description of the Prior Art

The superconducting electronics that utilize the phase difference found among a plurality of superconducting components by using a multiband superconductor has been already known publicly (refer to JP-A 2003-209301 and JP-A 2005-085971, for example).

The bits to be used as basic elements of operation in these electronics are formed by utilizing an interband phase difference soliton (hereinafter referred to simply as "soliton"). The efficient generation of a soliton and the development of a method for the detection thereof are fundamental techniques for these electronics. Incidentally, the "soliton" used in the present invention has a feature of phase defect movable in a superconductor without accompanying any magnetic flux and, therefore, is to be distinguished from a fluxon.

For the sake of searching for materials that befit manufacturing circuits, available are (1) a method of search for a material, which comprises applying a DC, thereby generating a soliton between a superconductor and an electrode and determining the voltage generated by the extinction of the soliton with a voltage terminal and (2) a method of search for a material, which comprises determining fractional flux quantum generating in the superconductor loop due to a soliton (refer, for example, to the two prior art references mentioned above, "Soliton in Two-Band Superconductor," Y. Tanaka, Physical Review Letters, Vol. 88, Number 1, Art. No. 017002 and "Interband Phase Modes and Nonequilibrium Soliton Structures in Two-Gap Superconductors," A. Gurevich and W. M. Vinokur, Physical Review Letters, Vol. 90, Number 4, Art No. 047004).

In the technique utilizing the soliton as described above, a technique for manufacturing a material into a thin film, a technique for preparing a circuit and a technique for accurate determination of magnetic field and voltage have been found necessary.

Particularly, since the technique for determining magnetic field makes use of the principle that the flux quantum generated by the soliton assumes a halfway value, namely a value less than the ordinary flux quantum ($2 \times 10^{-7}$ gauss $cm^{-2}$) (refer to "Soliton in Two-Band Superconductor," Y. Tanaka, Physical Review Letters, Vol. 88, Number 1, Art. No. 017002), the request for this technique is serious. It is not easy to fulfill this request.

Further, the technique for manufacturing the electrode that is required by the technique for determining the voltage is not easy to attain. The multilayer high-temperature superconducting material, for example, that is a typical soliton candidate material is an oxide and generally necessitates use of gold as an electrode. It has been known that the establishment of ohmic contact between gold and an oxide material is not an easy thing (refer to "Low-resistivity contacts to the surface of superconductor thin films," E. Harashima, N. A. Khan, Y. Sekita, K. Ishida, H. Ihara, SUPERCONDUCTOR SCIENCE & TECHNOLOGY 15 (1), pp. 29-31, January 2002).

This invention has been directed to the task of realizing a method for easy non-contact search for a material capable of generating a soliton without requiring a bulk material or a thin film material to be subjected to accurate determination of voltage or magnetic flux.

SUMMARY OF THE INVENTION

This invention, for the purpose of fulfilling the task mentioned above, provides as the first aspect thereof a method of searching for a material fated to generate an interband phase difference soliton, comprising the steps of generating an AC in a soliton candidate material, identifying a loss of AC magnetic susceptibility of the siliton candidate material due to a turn and a twist cut of a vortex line and judging whether or not the soliton candidate material is capable of generating soliton.

In the second aspect of this invention that includes the first aspect, the step of generating the AC comprises applying a DC magnetic field to the soliton candidate material, thereby generating a vortex line within the candidate material and further applying an AC magnetic field to the candidate material, thereby rotating the vortex line, and the step of identifying the loss comprises determining the AC magnetic susceptibility of the soliton candidate material at a temperature in a range of a superconductor transition temperature and 0 K.

In the third aspect of this invention that includes the first or second aspect, the step of identifying the loss comprises determining the AC magnetic susceptibility in consequence of a change of a frequency of an AC magnetic field at a fixed temperature to judge a presence of a resonance frequency.

This invention can easily search out a material capable of generating a soliton while completely obviating the burden of involving various troublesome and difficult works in the determination of a minute magnetic field and the determination of voltage as experienced heretofore.

The technique of searching for a soliton material that is provided by this invention can mature into a highly practical technique of searching for a material in the future and is expected to contribute very much to the technical field of this nature.

The above and other objects, characteristic features and advantages of the present invention will become apparent to those skilled in the art from the description to be given herein below with reference to the accompanying drawings.

BRIEF DESCRIPTION OF THE DRAWINGS

FIG. 3a is a perspective view of a vortex line originating in the diamagnetic effect of a conventional superconductor (a material incapable of generating a soliton) and FIG. 3b is a plan view of the vortex line of FIG. 3a.

DETAILED DESCRIPTION OF THE PREFERRED EMBODIMENTS

The present invention will be described below by reference to examples shown in the drawings.

The principle of this invention will be described. The soliton is a nonlinear wave that is disposed to propagate without changing qualities, such as shape and speed, exhibit stability against mutual collision and retain individuality. In the interband phase difference soliton, the phase difference between the two superconducting components existing on two bands constitutes the medium for carrying the wave.

Generally, when a magnetic field is applied from outside to a superconducting material, a vortex (vortex line) of superconducting electric current occurs inside the superconducting material. It has been known that in the case of a superconducting material that is disposed to generate a soliton, the rotation of the vortex line by dint of an AC magnetic field results in generating a peak value in the loss of the AC magnetic susceptibility (hereinafter referred occasionally to as "loss peak"). This invention has perfected the method of searching in consequence of taking notice of this point.

In the determination of the AC magnetic susceptibility of a soliton candidate material, this invention concerns a method of searching for a material capable of generating soliton by applying to a candidate material a magnetic field prescribed for determination, thereby generating a vortex line, further applying an AC magnetic field to the candidate material, thereby inducing rotation of the vortex line and identifying the loss peak generated in consequence of the rotation of the vortex line and consequently effecting the search.

More specifically, when the vortex line generated in consequence of the application of the determination-oriented magnetic field is rotated by the application of the AC magnetic field, the vortex line is twisted and cut with a loss of energy. This loss of energy entails a loss of the AC magnetic susceptibility. This invention is directed to a method of searching for a material, which method is characterized by fulfilling the search for a soliton candidate material by identifying the peak value of this loss.

Here, the loss peak of the AC magnetic susceptibility induced by the rotation of the vortex line in the presence of the AC magnetic field will be described in more detail.

Figure 3A:
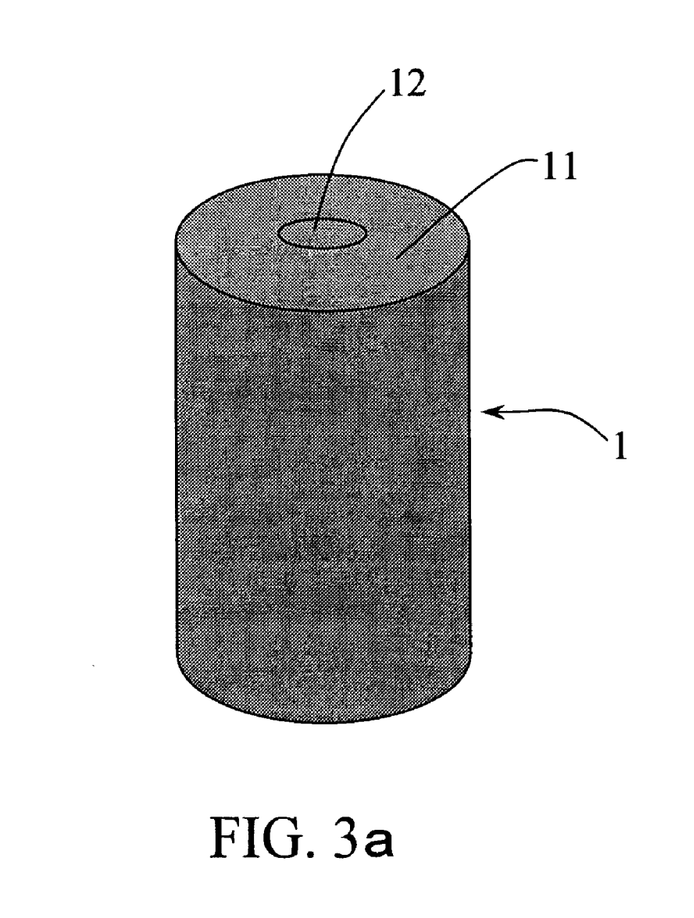
Figure 3B:
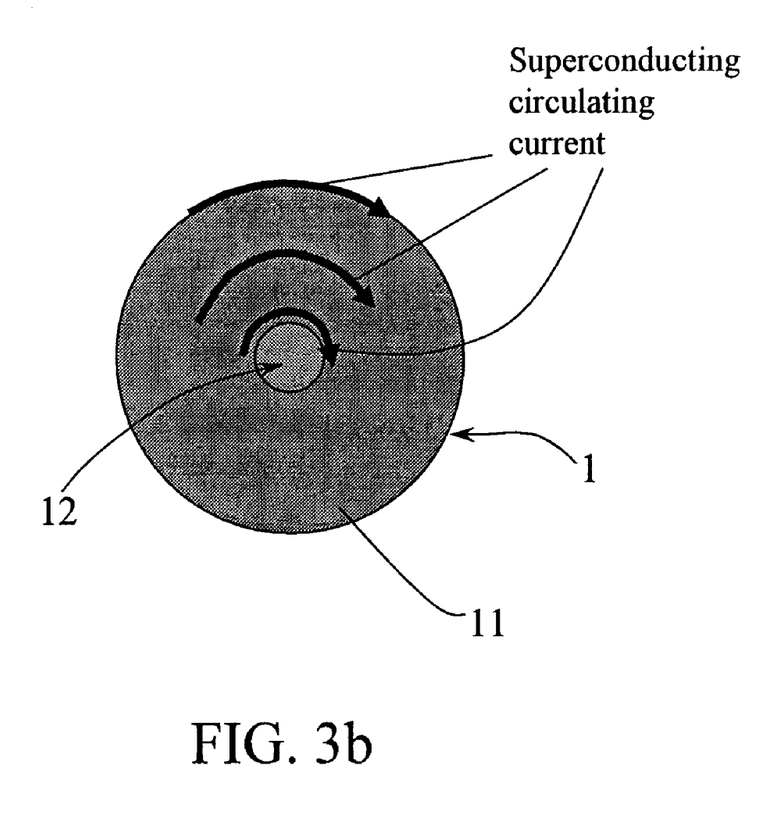

In the case of the conventional superconductor (a material incapable of generating a soliton), as illustrated in FIG. 3a and FIG. 3b, a vortex line 11 originating in the diamagnetic effect has a superconducting circling flow on a circle that centers around a normal conducting core 12 as an axis. For this reason, the vortex line 11 assumes the shape of a round tube. A magnetic flux 1 is generated along the normal conductor core 12 constituting the axis of the tube. In the material in which the vortex line becomes a round tube, the vortex line neither rotates around the axis nor twists and cuts in consequence of rotation at all.

In contrast, in the case of a material which is a multiband superconductor and is capable of generating a soliton, the circulating electric current is rotating around a plurality of divided normal cores (refer to "Deconfinement of Vortices with Continuously Variable Fractions of the Unit Quanta in Two-Gap Superconductors," Jun Goryo, Singo Soma and Hiroshi Matsukawa, cond-mat./0608015). The divided normal cores are mutually "bound" with a soliton cloud and this state of bondage corresponds to the formation of a molecule by the union of a plurality of ions or atoms with an electron cloud and is passing under the designation of a magnetic flux molecule.

Figure 4A:
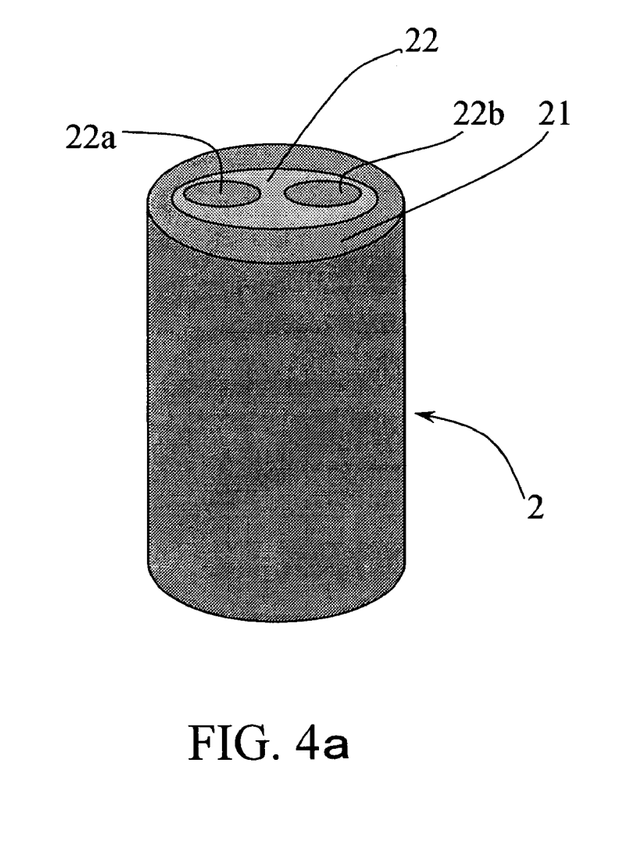
FIG. 4a is a perspective view of a vortex line originating in the diamagnetic effect of a material which is a multiband superconductor and which is capable of generating a soliton.
Figure 4B:
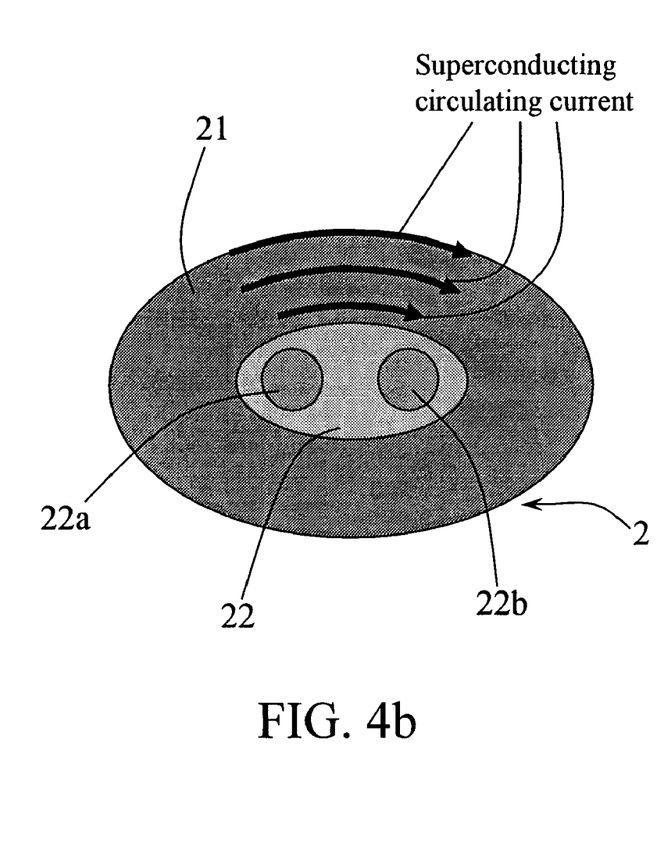
FIG. 4b is a plan view of the vortex line of FIG. 4a, and FIG. 4c is a schematic view illustrating the state in which the vortex line not round is being screwed up.

The normal core is divided into a core 22a and a core 22b as illustrated in FIG. 4a and FIG. 4b, for example, and are integrated in consequence of the union of these cores with a soliton cloud 22. The electric current components that have the cores 22a and 22b as their centers of circling are both circling around the cores 22a and 22b. The whole circling electric currents (a vortex line 21) give rise to a magnetic flux 2 (Interpretation of Abnormal AC Loss Peak Based on Vortex-Molecule Model for Multicomponent Cuprate Superconductor, Japanese Journal of Applied Physics, Vol. 46, No. 1, 2007, pp. 134-145, Y. Tanaka, A. Crisan, D. D. Shivagan, A. Iyo, K. Tokiwa and T. Watanabe).

In the material which is a multiband superconductor and is capable of generating a soliton, such two kinds of vortex lines, one round and the other not round, are present. Incidentally, the vortex lines of the conventional superconductor are invariably round vortex lines. The term "round vortex line" means a vortex line that has rotation symmetry with respect to its axis and the term "not round vortex line" means a vortex line that has no rotation symmetry with respect to its axis.

Figure 5:
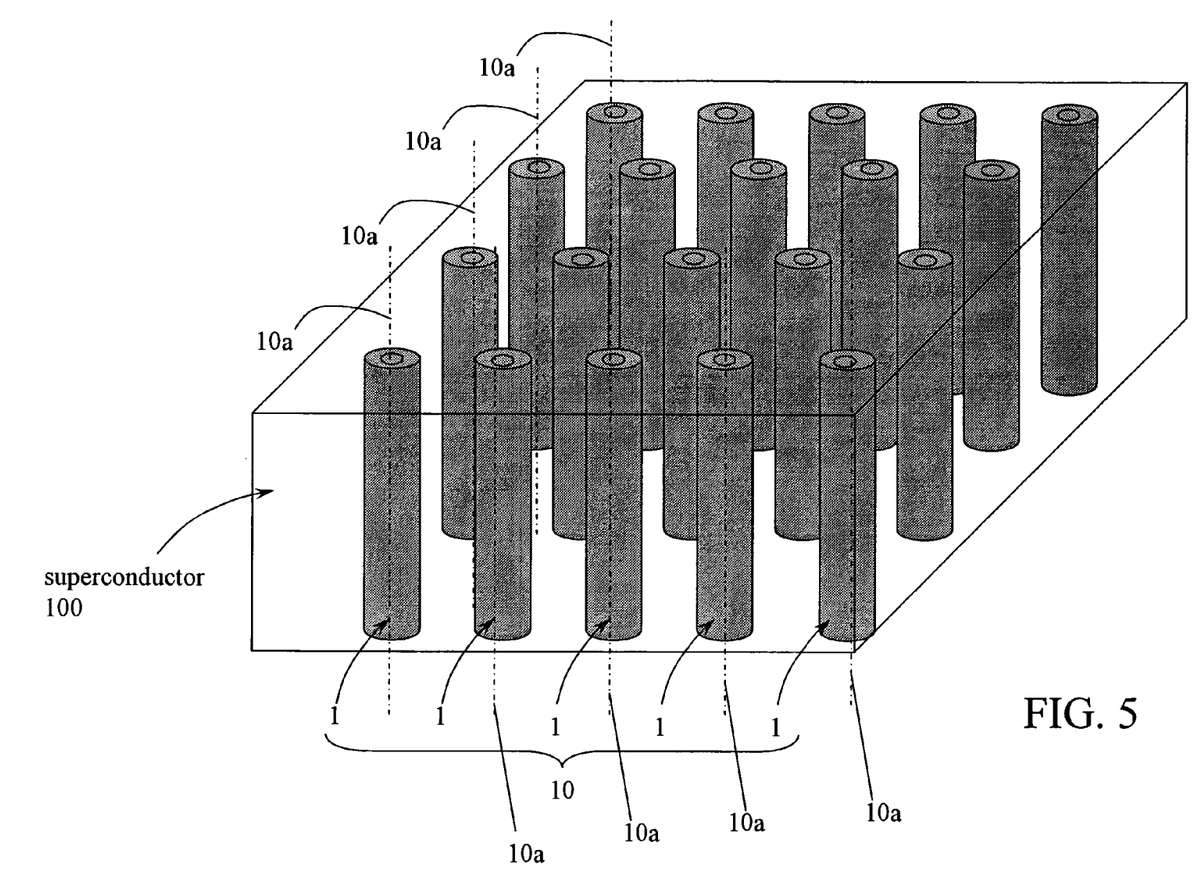
FIG. 5 illustrates the case of round vortex lines and depicts magnetic flux lattices composed by the individual magnetic fluxes generated respectively by the vortex lines.

In the case of round vortex lines, the individual magnetic fluxes 1 generated by the individual vortex lines are so disposed at individual lattice points 10a in a superconductor 100 as to run mutually parallel to form a magnetic flux lattice 10 as illustrated in FIG. 5. This magnetic flux lattice 10 is called an Abrikosov's lattice. It is reported that the magnetic fluxes 1 are deformed in a lateral direction by the thermal fluctuation of the vortex lines and, when the average value of deviations of the magnetic fluxes 1 from the lattice points 10a exceeds 15% of the gap between the lattices, the magnetic fluxes 1 are arranged randomly and the lattice points get into a state like the liquid state (refer to "Introduction to Superconductivity," Second Edition, Michael Tinkham, McGraw-Hill, Inc. Section 9.5, pp. 337).

It is also known that when an AC magnetic field is applied to a superconductor, such magnetic flux lattices are fused with loss of AC magnetic susceptibility (refer to "Characterization of high-temperature superconductors by AC susceptibility measurements," Fedor Gomory, Supercond. Sci. Technol., 10 (1997), pp. 523-543 and "Irreversibility line in $YBa_2Cu_3O_y$, thin films: Correlation of transport and magnetic behavior," J. Deak, McElfresh, John R. Clem, Zhidong Hao, M. Konczykowski, R. Muenchausen, S. Foltyn and R. Dye, Physical Review B 49 (1994) p. 6270, etc.).

Figure 4C:
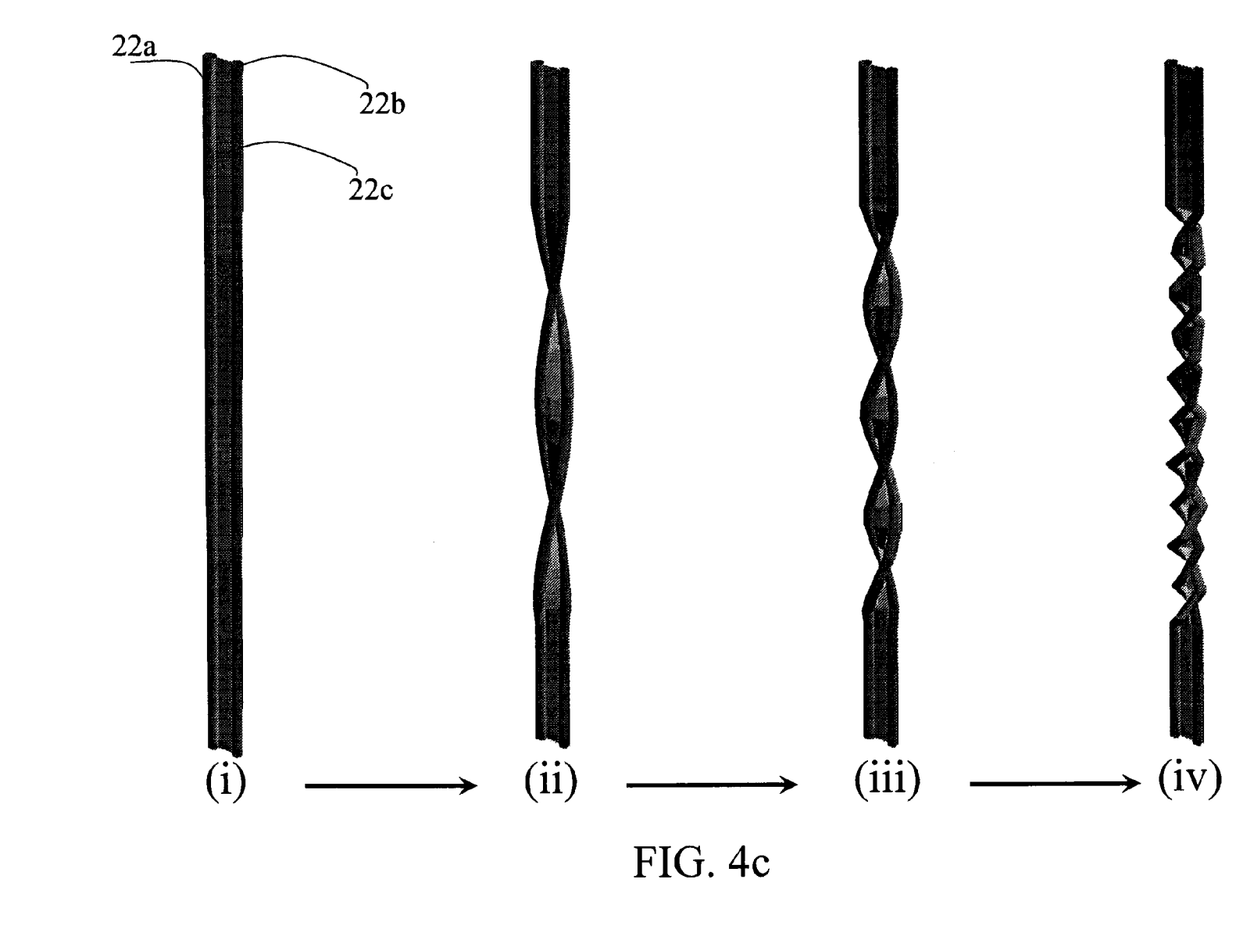

Meantime, the vortex lines that are not round can be rotated by means of an AC magnetic field. As described in the foregoing, in the case of the material that is a multiband superconductor and is capable of generating a soliton, the normal core is divided into a core 22a and a core 22b. When the angles of rotation of the cores 22a and 22b differ from one locality to another, the vortex line 21 not round can be twisted up as if a coil spring were wound up. FIG. 4c illustrates that the vortex line 21 not round is being screwed up. The vortex line 21 has its core divided into cores 22a and 22b and is twisted more strongly in proportion as the state proceeds in a manner of (i)→(ii)→(iii)→(iv). Finally, this vortex line is snapped. At the time that the vortex line is snapped, it is deprived of energy. This loss of energy is observed as a loss in the determination of AC magnetization. Even when the vortex line does not go the length of being eventually snapped, the rotation of the vortex line alone possibly results in such a loss.

Such being the case, the material which is a multiband superconductor and which is capable of generating a soliton exhibits a visually discernible loss peak of the AC magnetic susceptibility without discretion between a round vortex line and not a round vortex line. By identifying such a loss peak, therefore, it is made possible to search for a material that is capable of generating a soliton.

While the conventional superconductor only entails the loss peak relating to the fusion of magnetic flux lattices directly under a superconductor transition temperature, the material that is capable of generating a soliton at all is further enabled to identify the loss peak originating in the rotation of the vortex line at a lower temperature.

While the loss peak that originates in the fusion of the magnetic flux lattices possesses no resonance frequency and lacks dependency on frequency, the loss peak that originates in the rotation of the vortex line possesses resonance frequency and the position of the generation of a peak is sensitive to frequency. Thus, they can be discriminated.

The question whether or not a superconducting material under test possesses a loss peak originating in the rotation of a vortex line can be judged as follows. For a start, a DC magnetic field is applied to the superconducting material under test at a temperature higher than the superconductor phase transition temperature Tc. Then, the AC magnetic field of 10 kHz is further applied to the material under test. Under the conditions under which the DC magnetic field and the AC magnetic field are applied simultaneously, the material under test is tested for the AC magnetic susceptibility at a temperature in the range of Tc to 0 K. Under the same conditions as those mentioned above, the material under test is tested for AC magnetic susceptibility while using an AC magnetic field of a frequency other than 10 kHz. Thus, the presence of the loss peak of the AC magnetic susceptibility is confirmed and the temperature at which the loss peak is generated is identified as well.

Figure 1:
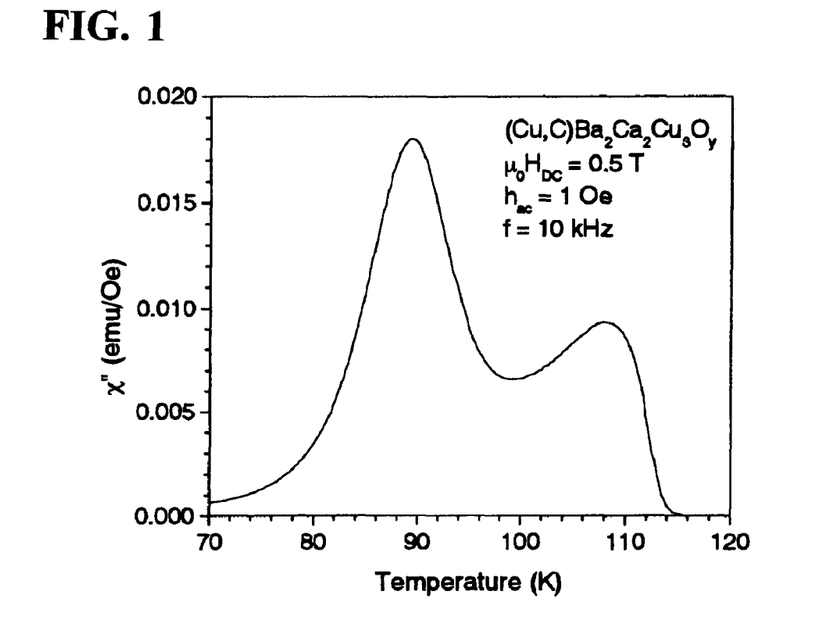
FIG. 1 illustrates the temperature dependency of AC magnetization.

When the step of determining the temperature dependency of the AC magnetic susceptibility ascertains that the AC magnetic susceptibility generates a plurality of loss peaks depending on the temperature, the AC magnetic field of a frequency falling short of 10 kHz is applied to the subject under test while the subject is maintained at a fixed temperature lower than the temperature at which the loss peaks on the lower temperature side of the plurality of loss peaks take place under conditions under which a fixed DC magnetic field is applied to the subject, with the object of determining the frequency dependency of the AC magnetic susceptibility. The reason for fixing the temperature as described above is that the resonance frequency of the loss peak of the AC magnetic susceptibility falls below 10 kHz at a temperature that falls short of the loss peak temperatures on the lower temperature side of the AC magnetic susceptibility found under application of an AC magnetic field of 10 kHz. The determination of the frequency dependency of the AC magnetic susceptibility prefers to be repeated while the magnitude of the DC magnetic field is varied and the other conditions are kept intact. On the temperature region side immensely lower than the temperature at which the loss peak on the lower temperature side takes place, the identification of the resonance frequency of the AC magnetic susceptibility becomes difficult because the ratio of change of the AC magnetic susceptibility becomes very small as illustrated in FIG. 1. When a loss peak temperature on the lower temperature side of the AC magnetic susceptibility is detected under the AC magnetic field of 10 kHz, for example, it is therefore preferable to determine the frequency dependency of the AC magnetic susceptibility in a temperature range from the lower temperature side skirt of the temperature at which the loss peak on the lower temperature side is manifested toward immediately before the temperature at which the loss peak is manifested.

In the case of a material which is a multiband superconductor and which is capable of generating a soliton, a component of the AC magnetic susceptibility thereof obtained in consequence of the rotation of the vortex line molecule can be expressed as the following functional formula (1).

$$\frac{A}{\{(\omega_o^2 - \omega^2) - i\Gamma\omega\}} = A \times \frac{\{(\omega_o^2 - \omega^2) + i\Gamma\omega\}}{\{(\omega_o^2 - \omega^2)^2 + \Gamma^2\omega^2\}} \quad (1)$$

In the formula (1), A and $\Gamma$ each denote a constant, $\omega$ denotes a frequency, and $\omega_o$ denotes a resonance frequency. A material which is a multiband superconductor and which is capable of generating a soliton possesses an out-of-phase component or loss component (x") of the AC magnetic susceptibility, which component is expressed by the following formula (2).

$$x'' = A\Gamma\omega/\{(\omega_o^2 - \omega^2)^2 + \Gamma^2\omega^2\} \quad (2)$$

Incidentally, the resonance frequency $\omega_o$ possesses magnetic field dependency. As regards DC magnetic fields differing in magnitude, therefore, the presence of a loss peak originating in the rotation of a vortex line can be determined further accurately by determining the frequency dependency of the AC magnetic susceptibility in the individual DC magnetic fields.

A material capable of generating a soliton has the central core of a vortex line possibly divided into three pieces or more. Even in such a case, the loss peak due to rotation and twist and cut is manifested. In the light of the spirit of this invention, even such a case is embraced in the contents of this invention.

Now, an example of the method of this invention that searches for a material capable of generating an interband phase difference soliton will be described below. The method starts with preparing an oriented sample of the micro-crystal of a superconductor fated to serve as a candidate for a soliton material.

To prepare this oriented sample, a sample is synthesized by the high-pressure synthesizing technique and it is finely pulverized. Then, a bulky oriented sample is prepared by dispersing the resultant powder in epoxy resin and solidifying the resin under application of a magnetic field thereto (refer to Vortex melting line and anisotropy of high-pressure-synthesized $TlBaBa_2Ca_2Cu_3O_{10-y}$, high-temperature superconductor from third-harmonic susceptibility studies, Crisan A., Iyo A. and Tanaka Y., APPLIED PHYSICS LETTERS 83 (3): pp. 506-508 Jul. 21, 2003).

This method of manufacturing an oriented sample is required to obtain as fine crystal grains as possible so that these grains may be divided and separated satisfactorily. If the grains are not satisfactorily separated, the vortex lines existing in the grain boundaries will induce a loss in all the temperature regions to thereby conceal the loss peaks due to rotation and consequently disable identification of peaks due to rotation.

To be specific, first a superconductor expected to constitute a candidate of soliton material is thoroughly pulverized to obtain a superconducting powder. Then, this powder and epoxy resin are weighed out in amounts calculated to account for a weight ratio in the range of 1:3 to 1:1, these components are thoroughly mixed till the powder is sufficiently dispersed in the epoxy resin, and the resultant mixture is placed in a tube and left standing at room temperature under a DC magnetic field of 7 T, for example, for about 12 hours. Subsequently, the tube is removed and the residual tubular mixture of a weight in the range of 100 mg to 200 mg is put to use as an oriented sample.

The oriented sample prepared as described above is tested for AC magnetic susceptibility. The determination of the AC magnetic susceptibility itself can be implemented by using the heretofore known technique (refer to Vortex melting line and anisotropy of high-pressure-synthesized TlBaBa$_2$Ca$_2$Cu$_3$O$_{10-y}$, high-temperature superconductor from third-harmonic susceptibility studies, Crisan A, Iyo A. and Tanaka Y., APPLIED PHYSICS LETTERS 83 (3): pp. 506-508 Jul. 21, 2003).

This example utilized as a soliton candidate material a multilayer high-temperature superconductor, (Cu, C)Ba$_2$Ca$_2$Cu$_3$O$_y$. Then, this candidate material was pulverized as described above, dispersed in the epoxy resin and solidified under application of a DC magnetic field of 0.5 T while introducing an external magnetic field. The soliton candidate material contained in the oriented sample thus prepared was induced by the external magnetic field to form a vortex line below a superconducting transition temperature and this vortex line was further caused to form magnetic flux lattices.

The oriented sample was then tested for AC magnetic susceptibility. The AC magnetic field of 1 Oe was applied to the oriented sample and the temperature was gradually lowered from the superconducting transition temperature downward. The results of the determination were as shown in FIG. 1. What appears in the neighborhood of 105 K in FIG. 1 is the loss peak of the AC magnetic susceptibility relating to the fusion of ordinary magnetic flux lattices. It is commonly observed in ordinary high-temperature superconductors.

What appears in the neighborhood of 88 K is the loss of AC magnetic susceptibility owing to the loss of energy induced when the vortex line is twisted and cut and recombined in consequence of the rotation of the magnetic flux molecules.

Figure 2:
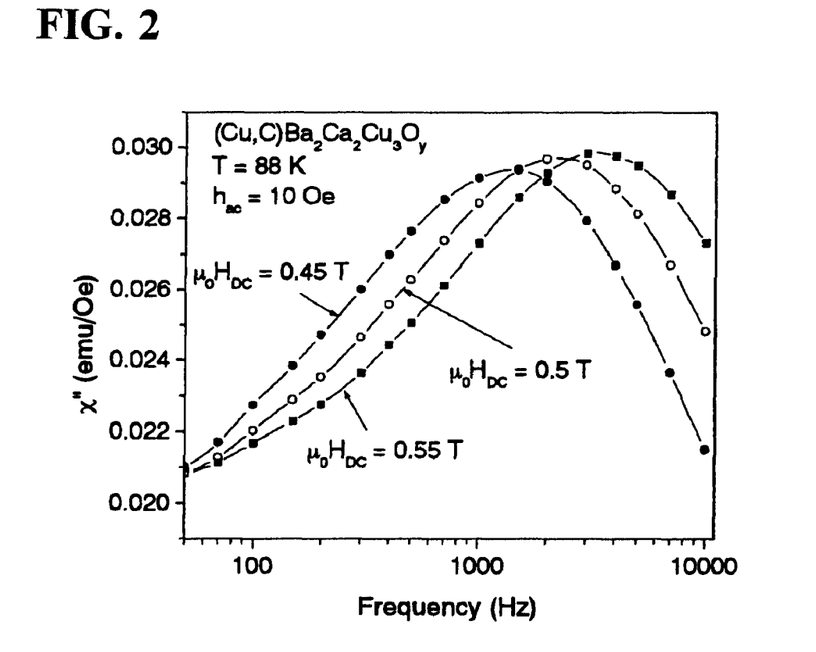
FIG. 2 illustrates an example of the determination of a resonance frequency.

The oriented sample was subjected to application of a DC magnetic field of a fixed magnitude and cooled from 130 K downward. When the temperature of the oriented sample reached 88 K, the oriented sample was kept at that temperature and tested for frequency dependency of AC magnetic susceptibility. At the varied applied DC magnetic fields of 0.45 T, 0.5 T and 0.55 T, the oriented sample was tested for frequency dependency of the AC magnetic susceptibility. The results are as shown in FIG. 2.

The out-of-phase component (x") of the AC magnetic susceptibility can be expressed by formula (2) as already mentioned. The resonance frequency $\omega_o$ possesses magnetic field dependency. It is seen from FIG. 2 that the frequency at which the peak of AC magnetic susceptibility is manifested by varying the intensity of the applied DC magnetic field is shifted toward the higher frequency side. It is therefore known that the AC magnetic susceptibility of the soliton candidate material possesses frequency dependency similar to that in formula (2) and that the frequency at which the peak is manifested possesses DC magnetic field dependency. It is known therefore that, in FIG. 2, the portions at which the individual curves of the AC magnetic susceptibility form respective peaks are the resonance frequencies that allow generation of loss peaks originating in the rotation of a vortex line. By determining the AC magnetic susceptibility based on this invention, therefore, it can be judged that the soliton candidate material is a multiband superconductor and as well is a material capable of generating a soliton.

Figure 6:
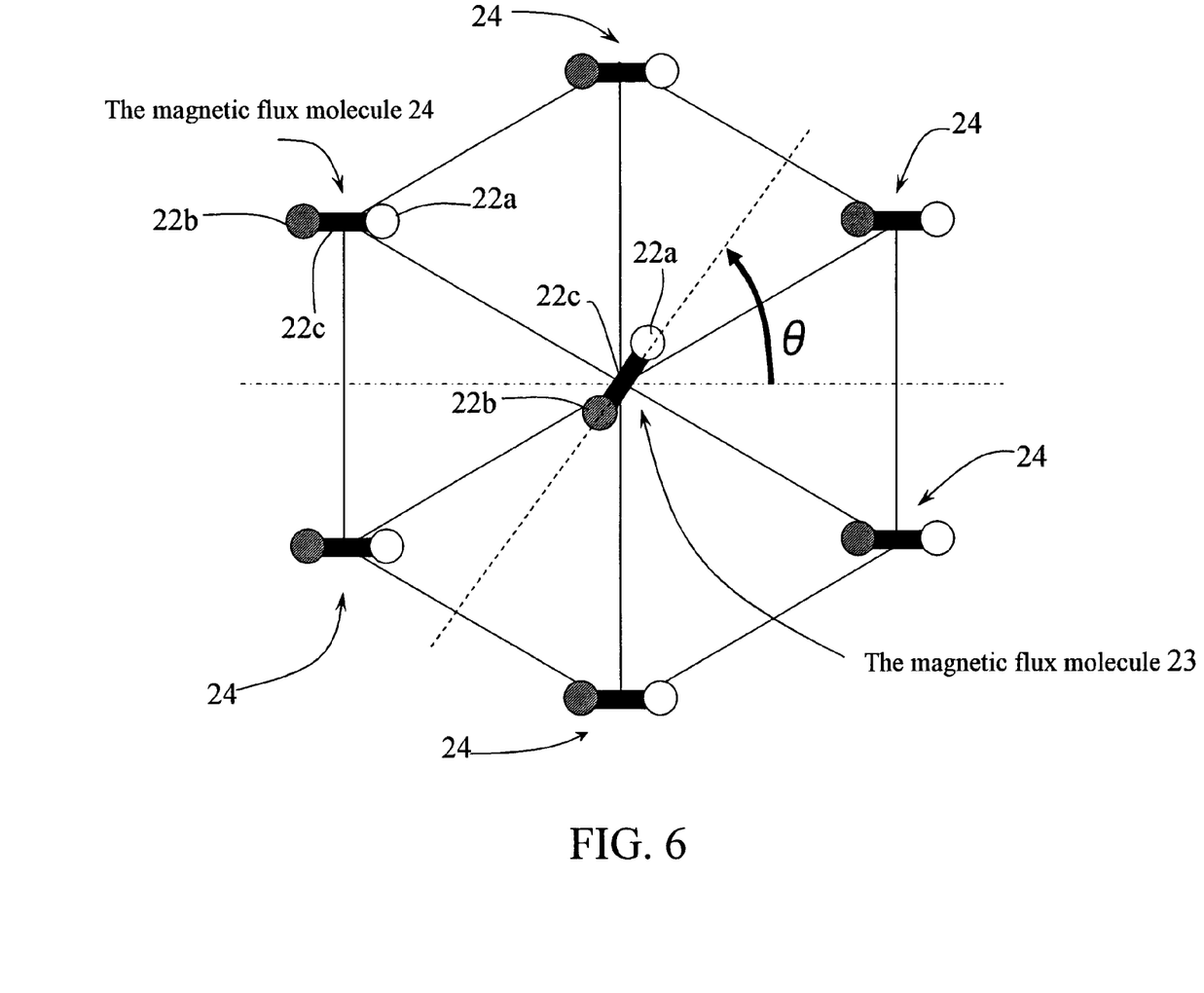
FIG. 6 is a schematic view illustrating the positional energy depending on the rotation of the magnetic flux molecule of multilayer high-temperature superconductor, $(Cu, C)Ba_2Ca_2Cu_3O_y$.

The motion caused in a vortex line by an AC magnetic field is a translational oscillation. In the periphery of a lattice point that is the average position of the presence of a vortex line, however, rises and falls (a swell) of the positional energy (potential energy) depending on the rotation of a magnetic flux molecule are generated by reflecting the symmetric property of hexagonal axis of the crystal structure of a multilayer high-temperature superconductor, (Cu, C)Ba$_2$Ca$_2$Cu$_3$O$_y$. The potential energy of this magnetic flux molecule depends on the angle θ formed by the magnetic flux molecule relative to the averaged location of the neighbor magnetic flux molecules as illustrated in FIG. 6. It is provided, however, that the direction of the magnetic flux molecules shown in FIG. 6 is a typical example of the direction. The individual magnetic flux molecules are oriented in respectively random directions at a given temperature of determination. Incidentally, the magnetic flux molecules 23 and 24 shown in FIG. 6 are constituted by the cores 22a and 22b connected with a soliton bond 22c that corresponds to the soliton cloud 22 shown in FIG. 4.

Intuitively, these magnetic flux molecules assume a state similar to the state that results from placing eggs in a washbasin. When the washbasin happens to have an undulating wall, the eggs are disposed to turn around by a longitudinal shake exerted thereon. This is because the undulating wall of the washbasin plays the role of a crank and converts the linear motion of a vortex line into a rotary motion.

This phenomenon takes place when the magnetic flux lattices are shaken with an AC. That is, the undulation of the potential energy relative to the direction of a magnetic flux molecule plays the role of a crank and converts the linear motion of a vortex line into a rotary motion. The AC involved herein is induced into the superconductor as a current capable of intercepting the AC magnetic field exerted from outside.

By preparing the graphs of FIG. 1 and FIG. 2 regarding the AC magnetic susceptibility based on the foregoing principle and then determining the presence or absence and the state of their peaks, therefore, it is rendered possible to identify the multilayered high-temperature superconductor, (Cu, C)Ba$_2$Ca$_2$Cu$_3$O$_y$ as a soliton material and implement the search therefore.

In the determination of the AC zonal magnetic susceptibility in this example, the loss peak of the AC zonal magnetic susceptibility was further observed at a low temperature besides the loss peak regarding the magnetic flux lattice fusion magnetic field directly under the superconductor transition temperature. Since this peak possessed a resonance frequency as illustrated in FIG. 2, it could be judged to be a loss peak originating in the rotation of a magnetic flux vortex line. The presence of the loss peak originating in the rotation of a magnetic flux vortex line means that the magnetic flux core of this material was divided and this material therefore could be judged to be a soliton material.

The embodiment of this invention in the method of searching for a material capable of generating an interband phase difference soliton has been described by reference to the example. It goes without saying that this invention does not need to be limited to such example but may be applied to various examples within the scope of technical matters recited in the claims annexed hereto.

In accordance with the method of searching for a material capable of generating an interband phase difference soliton in conformity with this invention, it is made possible to search easily for a material capable of generating a soliton without entailing the necessity of implementing the measurement of a fine magnetic field and the determination of a voltage tending to involve various complicated troubles and difficulties experienced heretofore. Thus, this invention can provide a practical technique of searching for a material in the technical field that utilizes a material capable of generating a soliton.

What is claimed is:

1. A method of searching for a material fated to generate an interband phase difference soliton, comprising the steps of generating an AC in a soliton candidate material, identifying a loss of AC magnetic susceptibility of the siliton candidate material due to a turn and a twist cut of a vortex line and judging whether or not the soliton candidate material is capable of generating soliton.

2. A method of searching for a material fated to generate an interband phase difference soliton according to claim 1, wherein the step of generating the AC comprises applying a DC magnetic field to the soliton candidate material, thereby generating a vortex line within the candidate material and further applying an AC magnetic field to the candidate material, thereby rotating the vortex line and wherein the step of identifying the loss comprises determining the AC magnetic susceptibility of the soliton candidate material at a temperature in a range of a superconductor transition temperature and 0 K.

3. A method of searching for a material fated to generate an interband phase difference soliton according to claim 1, wherein the step of identifying the loss comprises determining the AC magnetic susceptibility in consequence of a change of a frequency of an AC magnetic field at a fixed temperature to judge a presence of a resonance frequency.

4. A method of searching for a material fated to generate an interband phase difference soliton according to claim 2, wherein the step of identifying the loss comprises determining the AC magnetic susceptibility in consequence of a change of a frequency of the AC magnetic field at a fixed temperature to judge a presence of a resonance frequency.

* * * * *